(12) United States Patent
Kuo

(10) Patent No.: US 12,408,357 B2
(45) Date of Patent: Sep. 2, 2025

(54) CAPACITANCE STRUCTURE

(71) Applicant: Taiwan Semiconductor Manufacturing Company, Ltd., Hsinchu (TW)

(72) Inventor: Fu-Chiang Kuo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/510,787

(22) Filed: Nov. 16, 2023

(65) Prior Publication Data

US 2024/0088207 A1    Mar. 14, 2024

Related U.S. Application Data

(62) Division of application No. 17/360,376, filed on Jun. 28, 2021, now Pat. No. 11,855,129.

(60) Provisional application No. 63/166,571, filed on Mar. 26, 2021.

(51) Int. Cl.
  *H10D 1/68*   (2025.01)
  *H10B 12/00*  (2023.01)
  *H10D 1/00*   (2025.01)

(52) U.S. Cl.
  CPC .......... *H10D 1/696* (2025.01); *H10D 1/042* (2025.01); *H10D 1/043* (2025.01); *H10D 1/716* (2025.01); *H10B 12/0387* (2023.02); *H10B 12/37* (2023.02)

(58) Field of Classification Search
  CPC ......... H01L 28/75; H01L 28/91; H01L 28/92; H10B 12/37; H10B 12/0387; H10D 1/696; H10D 1/716; H10D 1/042; H10D 1/043
  See application file for complete search history.

(56) References Cited

U.S. PATENT DOCUMENTS

| | | | |
|---|---|---|---|
| 7,332,764 B2 | 2/2008 | Choi et al. | |
| 8,760,845 B2 | 6/2014 | Rocklein et al. | |
| 9,478,411 B2 | 10/2016 | Thombare et al. | |
| 11,855,129 B2 * | 12/2023 | Kuo | H01L 28/91 |

FOREIGN PATENT DOCUMENTS

| | | |
|---|---|---|
| TW | I543216 B | 7/2016 |
| TW | I708328 B | 10/2020 |
| TW | I716089 B | 1/2021 |

OTHER PUBLICATIONS

Gyu-Jin Choi, et al. "Atomic Layer Depostioion of TiO2 films on Ru Buffered TIN Electrode for Capacitor Applications" Journal of The Electrochemical Society, 156, G71-G77 2009.

Taiwan Office Action for Application No. 11420237970 Dated Mar. 10, 2025.

* cited by examiner

*Primary Examiner* — Richard A Booth

(74) *Attorney, Agent, or Firm* — Lippes Mathias LLP

(57) ABSTRACT

A capacitance structure comprises a metal nitride layer, such as a titanium nitride (TiN) layer, a compositionally graded film formed on a surface of the metal nitride layer by thermal oxidation, and a dielectric layer disposed on the compositionally graded film. A method of manufacturing a capacitance structure includes forming a conductive layer, performing thermal oxidation of a surface of the conductive layer to produce a compositionally graded film on the conductive layer, and forming a dielectric layer on the compositionally graded film.

20 Claims, 5 Drawing Sheets

CAPACITANCE STRUCTURE

This application is a divisional of U.S. Ser. No. 17/360,376 filed Jun. 28, 2021, now U.S. Pat. No. 11,855,129, which claims the benefit of U.S. provisional application Ser. No. 63/166,571 filed Mar. 26, 2021 and titled CAPACITANCE STRUCTURE. U.S. provisional application Ser. No. 63/166,571 filed Mar. 26, 2021 and titled CAPACITANCE STRUCTURE is incorporated herein by reference in its entirety.

BACKGROUND

The following relates to capacitance structures, on-chip capacitors, trench capacitors, and to integrated circuit (IC) devices employing same such as dynamic random access memory (DRAM) devices and other capacitance-based storage ICs, as well as voltage controlled oscillator (VCO) devices, phase-lock loops, operational amplifier (Op-amp) devices, and so forth.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
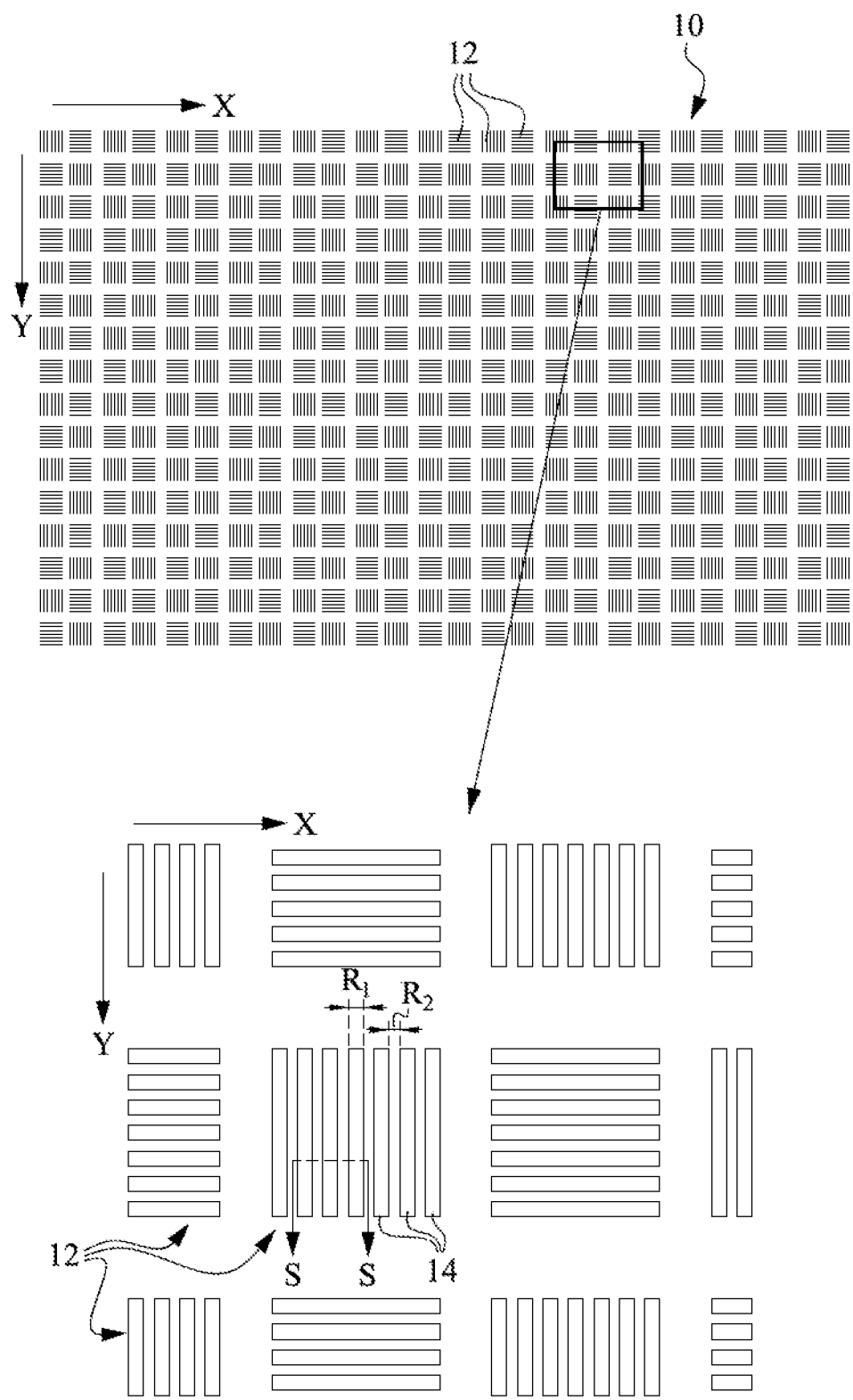
FIG. 1 diagrammatically illustrates a layout of a capacitance structure according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

On-chip capacitors find a wide range of uses in integrated circuit (IC) designs, such as dynamic random access memory (DRAM) devices and other capacitance-based storage ICs, voltage controlled oscillator (VCO) devices, phase-lock loops, operational amplifier (Op-amp) devices, and so forth. Some capacitance structures used in on-chip capacitors of types that are incorporated into ICs employ a conductive layer made of a conductive material, on which is deposited a dielectric layer made of a high-K dielectric material. The conductive material may comprise titanium nitride (TiN), a combination of titanium (Ti) and titanium nitride, tantalum nitride (TaN), tungsten (W), tungsten nitride (e.g. $W_2N$, WN, or $WN_2$), ruthenium (Ru), ruthenium nitride (RuN), iridium (Ir), platinum (Pt), or another low-resistivity material. The high-κ dielectric material (sometimes also referred to as a high-k dielectric material) may, for example, comprise silicon nitride ($Si_3N_4$), aluminum oxide ($Al_2O_3$), hafnium silicates (HfSiON), tantalum oxide ($Ta_2O_5$), zirconium oxide ($ZrO_2$), hafnium oxide ($HfO_2$), titanium oxide ($TiO_2$), barium strontium titanate oxide, strontium titanate oxide, and combinations thereof. In some capacitance structures, the high-κ dielectric layer may comprise a laminate such as a zirconium oxide/aluminum oxide/zirconium oxide (e.g., $ZrO_2$—$Al_2O_3$—$ZrO_2$) laminate, sometimes referred to as a ZAZ laminate.

Depending on the design, the capacitance structure may include a single conductive layer, a single high-κ dielectric layer, and a second conductive layer on top of the high-κ dielectric layer; or the capacitance structure may include two or more repetitions of the (conductive layer/high-κ dielectric layer) period topped by a top conductive layer.

Additionally, the geometry of the capacitance structure can vary. In a trench capacitance structure, a trench is formed in a base material (e.g., an epitaxial silicon layer, or silicon substrate or a layer or substrate of another material) and the one or more conductive layer/high-κ dielectric layer periods are deposited at least in part within the trench. For example, DRAM cells typically include trench capacitors as the storage elements. Deep trench capacitors can beneficially increase the capacitive area without a concomitant increase in the footprint of the capacitance structure. In a trench capacitor, a single conductive layer/high-κ dielectric layer period coats the interior walls of the trench, which is then filled with a conductive material. In other designs, two or more repetitions of the (conductive layer/high-κ dielectric layer) period can be used. In a common approach, the second conductive layer on top of the high-κ dielectric layer is fabricated as a filler that fills the trench.

However, it is recognized herein that a potential problem exists with a capacitance structure that employs a conductive layer on which a high-κ dielectric layer is formed. In such a structure, there may be instability at the interface between the conductive layer and the high-κ dielectric layer. This instability can be driven by differences between the materials making up the conductive and high-κ dielectric layers, such as different coefficients of thermal expansion and/or differences in microstructure, or structural weakness in the chemical and/or physical bonding between the layers at the interface, or so forth. The instability can lead to delamination at the interface between the conductive layer and the high-κ dielectric layer. For example, delamination can be a problem in a TiN/ZAZ stack.

With reference to FIG. 1, an illustrative multi-trench capacitance structure 10 is shown, which includes capacitance cells 12 arranged in a two-dimensional grid along orthogonal directions designated, without loss of generality, as an X-direction and a Y-direction (where the X- and Y-directions are mutually orthogonal). Each capacitance cell 12 in the multi-trench capacitance structure 10 has a set of seven mutually parallel trenches 14. The seven mutually parallel trenches 14 of each capacitance cell 12 are oriented orthogonally to (i.e., at a 90° angle to) the orientation of the seven mutually parallel trenches of the four capacitance cells located immediately adjacent along the −X, +X, −Y, and +Y directions, respectively. As seen in the enlarged view of a small area of the multi-trench capacitance structure 10 shown in the bottom portion of FIG. 1, each trench 14 has a width R1, and neighboring trenches are spaced apart by a distance R2. In one non-limiting illustrative example, the trench width R1 is about 0.20 microns and the spacing R2 is about 0.25 microns; however, other dimensions are contemplated. In some non-limiting illustrative embodiments, there are at least five trenches 14 per 100 microns, with at least one trench aspect ratio of greater than or equal to five. Again, these are merely illustrative examples.

Figure 2:
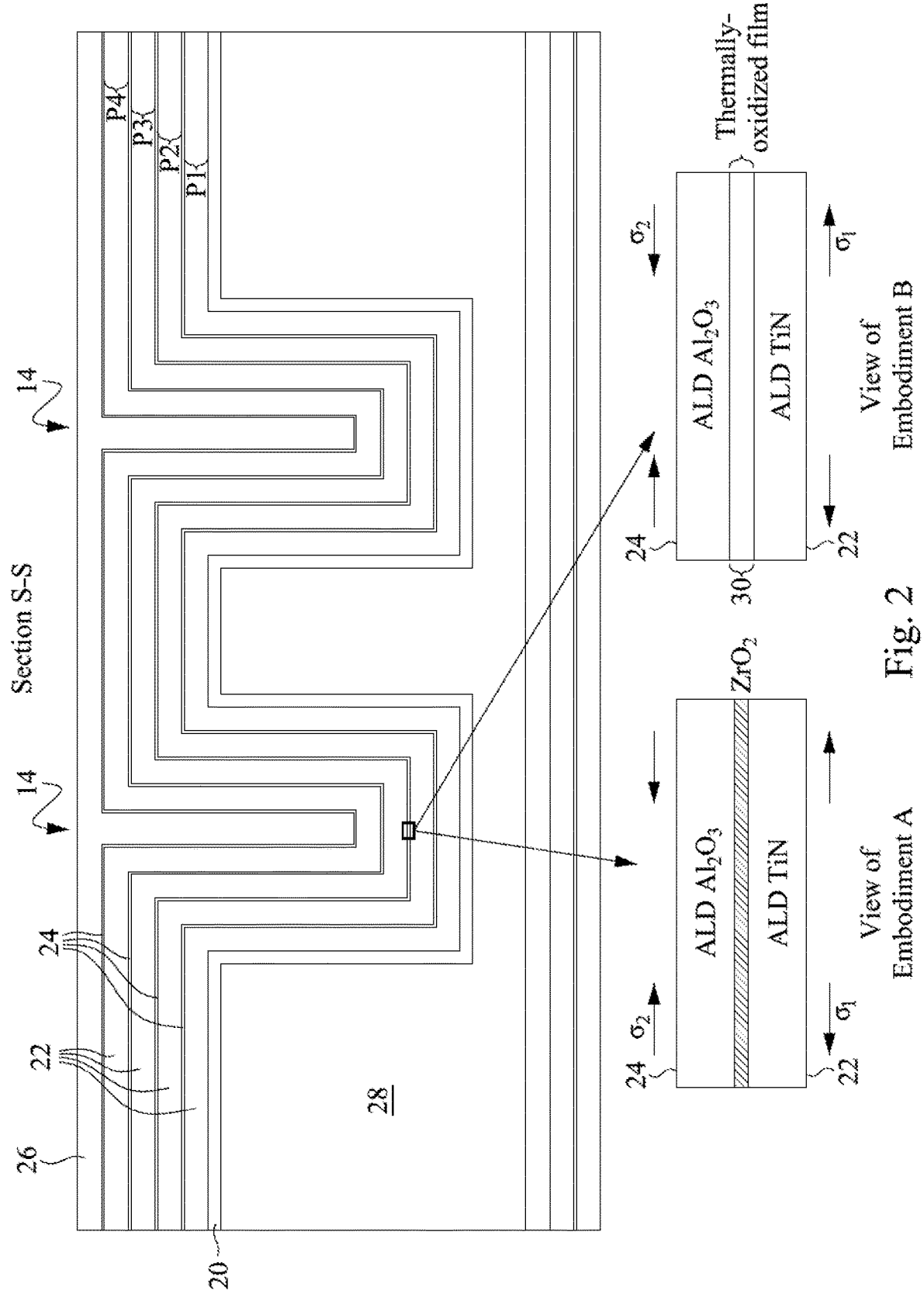
FIG. 2 diagrammatically illustrates Section S-S indicated in FIG. 1 along with two more specific nonlimiting illustrative embodiments diagrammatically shown below the Section S-S view.

With reference to FIG. 2, a Section S-S indicated in FIG. 1 is shown, illustrating two trenches 14. The illustrative trench structure includes a liner oxide 20 on which is disposed four periods P1, P2, P3, P4, with each period including a conductive layer 22 on which is disposed a high-κ dielectric layer 24. The periods P1, P2, P3, P4 are formed lining the trenches 14 to form multilayer trench capacitors. The conductive layers 22 may, by way of non-limiting illustrative example, comprise titanium nitride (TiN), a combination of titanium (Ti) and titanium nitride, tantalum nitride (TaN), tungsten (W), tungsten nitride (e.g. $W_2N$, WN, or $WN_2$), ruthenium (Ru), iridium (Ir), platinum (Pt), or another low-resistivity material. In some embodiments the conductive layers 22 comprise a metal nitride such as TiN, TaN, $W_2N$, WN, $WN_2$, ruthenium nitride (RuN), or so forth. The high-κ dielectric layers 24 may, by way of non-limiting illustrative example, comprise silicon nitride ($Si_3N_4$), aluminum oxide ($Al_2O_3$), hafnium silicates (Hf-SiON), tantalum oxide ($Ta_2O_5$), zirconium oxide ($ZrO_2$), hafnium oxide ($HfO_2$), titanium oxide ($TiO_2$), barium strontium titanate oxide, strontium titanate oxide, and combinations thereof, or a laminate such as a zirconium oxide/aluminum oxide/zirconium oxide (e.g., $ZrO_2$—$Al_2O_3$—$ZrO_2$) laminate, sometimes referred to as a ZAZ laminate.

A top conductive overlayer 26 completes the capacitance structure 10. The top conductive overlayer 26 may for example comprise any of the materials that may form the conductive layers 22, or another low-resistivity material. In some examples described herein, the base semiconductor material 28 on or in which the capacitance structure is formed comprises silicon, although the base semiconductor material may comprise another semiconductor material such as silicon carbide (SiC), silicon germanium (SiGe), or another silicon-based material, or a non-silicon based semiconductor material such as gallium arsenide (GaAs), indium phosphide (InP), aluminum gallium arsenide (AlGaAs), or another group III-group V compound semiconductor, or so forth. The base semiconductor material 28 may be a substrate (e.g., a silicon wafer), or the base semiconductor material 28 may be a layer deposited on a substrate, e.g. an epitaxial silicon layer deposited on a silicon substrate (and possibly with the epitaxial silicon having a different doping type and/or concentration compared with the silicon substrate). In yet another nonlimiting illustrative example, the base semiconductor material 28 may be the silicon layer of a silicon-on-insulator (SOI) wafer. In some designs, such as if the base semiconductor material 28 is a semi-insulating semiconductor or is lightly doped, it is contemplated to omit the liner oxide 20.

In some embodiments in which the capacitance structure is a trench capacitor (such as in the nonlimiting illustrative example of FIG. 2), the top conductive overlayer 26 may fill the portion of the trench not filled by the previous layers 22, 24, and may serve to planarize the trench capacitor, as shown in FIG. 2. To achieve this, in one approach the material forming the top conductive overlayer 26 is deposited to form a thick layer with a thickness sufficient to ensure that the trenches 14 are completely filled, and then the thick layer is planarized to produce a planar surface for the array of trench capacitors in which the trench capacitors are filled by the top conductive overlayer 26.

With reference to View of Embodiment A shown in FIG. 2, in one illustrative example described herein the conductive layers 22 comprise titanium oxide (TiN) deposited by atomic layer deposition (ALD), and the high-κ dielectric layers 24 comprise ZAZ (where the top $ZrO_2$ layer is not shown in the View of Embodiment A) deposited by ALD. The ALD-deposited TiN layers 22 had a thickness of about 20 nanometers while the ZAZ layers 24 had a thickness of about 7.0 nanometers. In Embodiment A the base semiconductor material 28 is silicon. In Embodiment A, differential thermal expansion between the ALD-deposited TiN layer 22 and the ALD-deposited ZAZ layer 24 results in the TiN layer 22 expanding relative to the ZAZ layer 24 (or, equivalently, results in the ZAZ layer 24 contracting relative to the TiN layer 22). This is indicated in Embodiment A by stress $\sigma_1$ for the TiN layer 22 and by opposite stress $\sigma_2$ for the high-κ dielectric layer 24. In experiments performed using a deep trench capacitance structure similar to capacitance structure 10 of FIG. 1, with four periods of TiN/ZAZ in accord with Embodiment A, significant delamination was observed by way of transmission electron microscopy (TEM).

Figure 3:
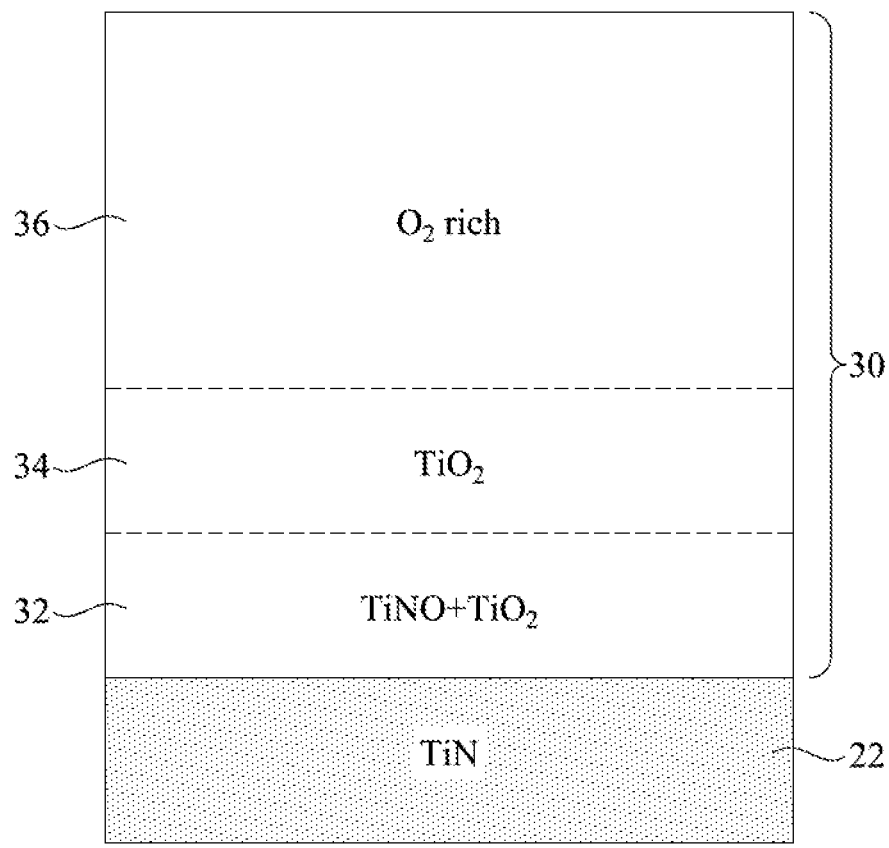
FIG. 3 diagrammatically illustrates a compositionally graded film according to an embodiment.

With reference to View of Embodiment B shown in FIG. 2, and with further reference to FIG. 3, in another illustrative example described herein the conductive layers 22 again comprises ALD-deposited titanium oxide (TiN). However, in Embodiment B, each high-κ dielectric layer 24 is formed by performing thermal oxidation of the surface of the underlying ALD-deposited TiN 22 as further described herein, prior to depositing an $Al_2O_3$ layer by ALD. The thermal oxidation produces a compositionally graded film 30 shown in more detail in FIG. 3. The compositionally graded film 30 formed on the surface of the TiN conductive layer 22 is produced by thermal oxidation, that is, heating the TiN 22 in an atmosphere containing oxygen to produce oxidation of the surface of the TiN 22. As diagrammatically shown in FIG. 3, the thermal oxidation produces a compositional grading in which a bottom portion 32 of the compositionally graded film 30 is a mixture of TiNO and $TiO_2$, a middle portion 34 of the compositionally graded film 30 is mostly $TiO_2$, and an upper portion 36 of the compositionally graded film 30 is an oxygen-rich composition of titanium and oxygen. While FIG. 3 illustrates three regions 32, 34, 36, it will be appreciated that the compositional grading may be gradual, so that there may not be abrupt interfaces defined between the regions 32, 34, 36. More generally, the compositionally graded film 30 includes a compositional gradient from a lowest oxygen/nitrogen ratio (that is, lowest fraction of oxygen) adjacent the TiN layer 22 to a highest oxygen/nitrogen ratio (that is, highest fraction of oxygen) adjacent the high-κ dielectric layer 24. Titanium dioxide (TiO$_2$), being a stable compound of titanium and oxygen, is expected to be predominant in the intermediate region 34 interposed between the upper region 36 and the lower region 32. More generally, if the conductive layer 22 is a metal nitride layer (e.g. TiN, TaN, W$_2$N, WN, WN$_2$, RuN, or so forth) then the compositionally graded film is expected to likely include a stable metal oxide formed by the thermal oxidation, where the metal of the stable metal oxide is a metal of the metal nitride layer 22 (e.g., if the metal nitride layer is TaN then TaO$_2$ is likely to be formed as a stable metal oxide).

As diagrammatically indicated in Embodiment B of FIG. 2, the differential strain between stress $\sigma_1$ of the TiN layer 22 and stress $\sigma_2$ of the Al$_2$O$_3$ layer is reduced. This in turn reduces the likelihood of delamination and reduces stress-induced wafer bending. Without being limited to any particular theory of operation, it is believed that the compositionally graded film 30 suppresses or eliminates stress-induced wafer bending and layer delamination at the interface between the conductive layer 22 and the oxide or other dielectric layer 24 by one or more of the following mechanisms.

In one possible mechanism, the compositionally graded film 30 provides a stress relaxation mechanism. The microstructure varies over the thickness of the compositionally graded film 30, which is formed at elevated temperature during the thermal oxidation process. The combination of gradual compositional change and disorder introduced by the thermal oxidation and the elevated temperature at which the thermal oxidation is performed facilitates dislocation slip and other structural mobility enhancing processes leading to stress relaxation.

In another possible mechanism, the compositionally graded film 30 provides improved adhesion between the conductive layer 22 and an oxide layer 24. The compositional grading provides a gradual transition from the nitrogen-rich TiN layer 22 (for example) to the oxygen-rich aluminum oxide layer 24 (for example). Due to the compositionally graded film 30 produced by the thermal oxidation, there is no abrupt transition from a nitride material to an oxide material. Rather, there is a gradual transition from the metal nitride (e.g., TiN) to a low oxygen/nitrogen ratio that gradually increases to a high oxygen/nitrogen ratio at the surface upon which the oxide layer 24 is deposited.

In another possible mechanism, the compositionally graded film 30 provides an opposing stress to that of the conductive layer 22 that is less than the opposing stress produced by the high-κ dielectric layer 24, so as to distribute the stress difference over a finite thickness rather than being present at a direct interface between the conductive layer 22 and the high-κ dielectric layer 24.

Figure 4:
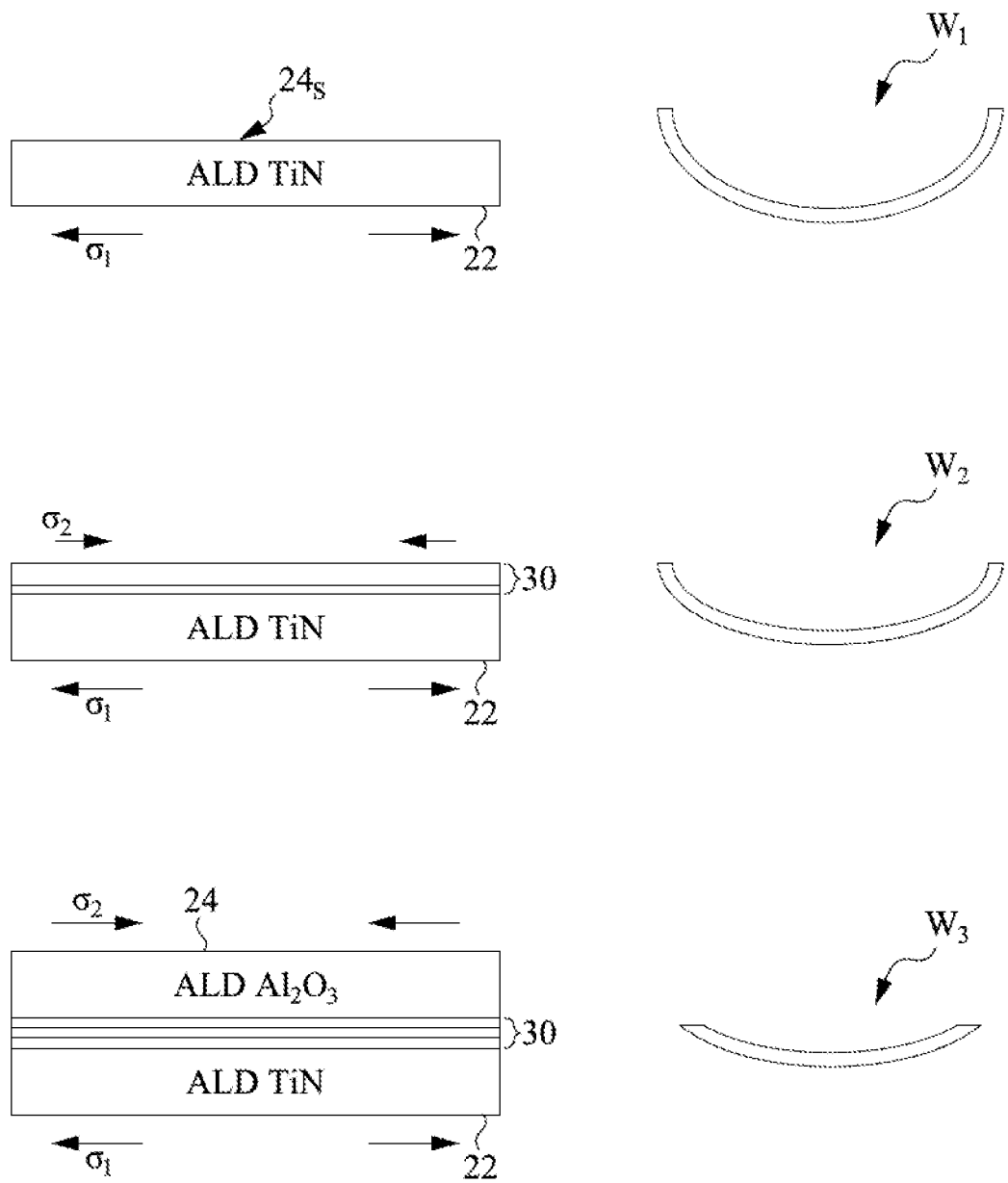
FIG. 4 diagrammatically illustrates a capacitance structure fabrication process according to an embodiment.

With reference to FIG. 4, the suppression of stress-induced wafer bending and layer delamination provided by the compositionally graded film 30 is diagrammatically shown. The top diagram of FIG. 4 shows the initially deposited conductive layer 22, namely an ALD-formed TiN layer in FIG. 4. The TiN layer 22 when deposited on a silicon wafer is observed to produce stress $\sigma_1$ as indicated. This stress $\sigma_1$ induces substantial warpage of the silicon wafer, as indicated by warpage W$_1$ diagrammatically shown in FIG. 4, top diagram. At this stage of the process, the TiN layer 22 has a top surface indicated as surface 24s in the top diagram of FIG. 4.

The thermal oxidation of the top surface 24s of the TiN layer 22 is then performed, thereby producing the compositionally graded film 30 as seen in the middle diagram of FIG. 4. The compositionally graded film 30 is shown in more detail in FIG. 3. The compositionally graded film 30 produces a film stress $\sigma_F$ that opposes the stress $\sigma_1$ produced by the TiN layer 22, as diagrammatically indicated by arrows in the middle drawing of FIG. 4. This countering stress $\sigma_F$ reduces the wafer warpage, as indicated by diagrammatically illustrated reduced wafer warpage W$_2$ shown in the middle diagram of FIG. 4.

Referring to the bottom drawing of FIG. 4, the subsequent formation of the high-κ dielectric layer 24 on the compositionally graded film 30, e.g. an oxide such as aluminum oxide formed by ALD, produces a further film stress $\sigma_2$ that further opposes the stress $\sigma_1$ produced by the TiN layer 22. This further countering stress $\sigma_2$ further reduces the wafer warpage, as indicated by diagrammatically illustrated reduced wafer warpage W$_3$ shown in the bottom diagram of FIG. 4.

While the illustrative example of FIG. 4 employs the TiN layer 22, it is expected that the compositionally graded film 30 can be similarly formed by thermal oxidation of other conductive metal nitride layers, such as a tantalum nitride (TaN) layer, a tungsten nitride (e.g. W$_2$N, WN, or WN$_2$) layer, a ruthenium nitride (RuN) layer, or so forth. For example, thermal oxidation of TaN is expected to produce an analogous compositionally graded film in which the bottom portion is a mixture of TaNO and TaO$_2$, a middle portion 34 is mostly TaO$_2$, and an upper portion is an oxygen-rich composition of tantalum and oxygen. Again, the compositional grading can be gradual, so that there may not be abrupt interfaces, and more generally the compositionally graded film formed by thermal oxidation of TaN is expected to include a compositional gradient from a lowest oxygen/nitrogen ratio (that is, lowest fraction of oxygen) adjacent the TaN layer to a highest oxygen/nitrogen ratio (that is, highest fraction of oxygen) adjacent the high-κ dielectric layer. Tantalum dioxide (TaO$_2$), being a stable compound of tantalum and oxygen, is expected to be predominant in the intermediate region interposed between the upper and lower regions of the compositionally graded film formed by thermal oxidation of a TaN layer.

Figure 5:
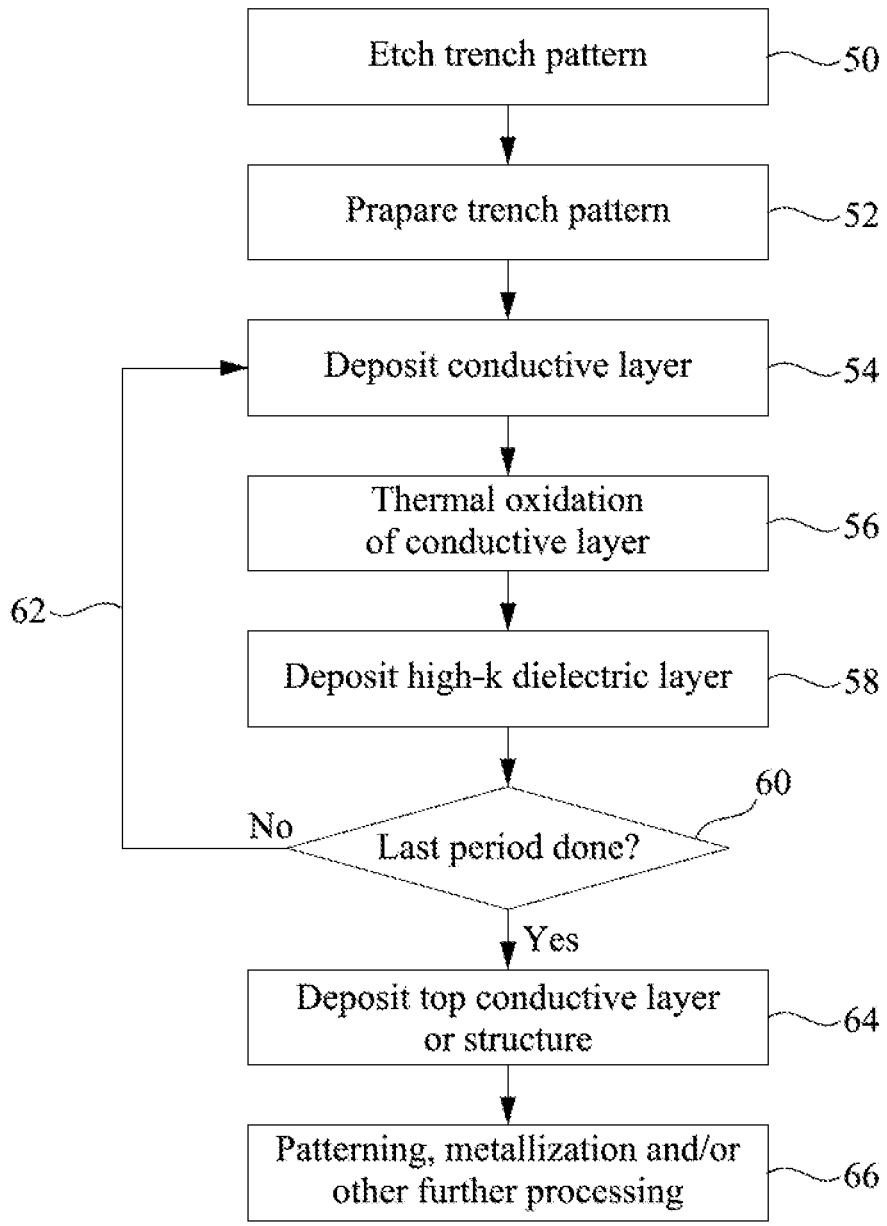
FIG. 5 diagrammatically illustrates a capacitance structure fabrication process according to an embodiment.

With reference to FIG. 5, a method of fabricating a capacitance structure is described. In an operation 50, a trench (in the case of a single trench capacitor) or a trench pattern of an array of trenches (in the case of an array of trench capacitors) is formed into a base semiconductor material, for example by lithographically patterned etching. The choice of a suitable etchant for forming the trench(es) depends on the type of base semiconductor material (for example, silicon, silicon germanium, silicon carbide, or so forth), the size and aspect ratio of the trench to be formed, and other factors. If the capacitance structure being fabricated is not a trench capacitor, then operation 50 may be omitted.

In an operation 52, the trench or trench pattern is prepared. This may involve, for example, depositing a liner oxide (such as the illustrative liner oxide 20 of FIG. 2). The trench preparation may optionally include other preparatory operations such as performing ion implantation. If the capacitance structure being fabricated is not a trench capacitor, then the operation 52 may be omitted or may entail preparing a surface on which the capacitance structure is to be fabricated.

In an operation 54, a (bottom) conductive layer is deposited. For example, this may be the TiN or other metal nitride layer 22 of FIGS. 2-4. More generally, the operation 54 may deposit the conductive layer as a TiN layer, a TaN layer, a tungsten layer, a tungsten nitride layer, a ruthenium layer, a ruthenium nitride layer, an Ir layer, a Pt layer, or a layer of another low-resistivity material. The deposition operation 22 may employ any deposition technique suitable for the chosen conductive layer material and the desired thickness. For depositing thin layers such as a conductive layer of a few nanometers in thickness, atomic layer deposition (ALD) is a suitable technique with good thickness control. More generally, the deposition operation 22 may employ chemical vapor deposition (CVD), sputtering, vacuum evaporation, or so forth. In the case of trench capacitor fabrication, the operation 54 deposits the conductive layer at least in the trench, and the deposited conductive layer may optionally extend outside the trench.

In an operation 56, the upper surface of the deposited conductive layer is thermally oxidized to form a compositionally graded film, such as the illustrative compositionally graded film 30 previously described with reference to FIG. 3. This can be done in various ways. In one approach, the thermal oxidation 56 comprises furnace oxidation in an oxygen-containing atmosphere for at least 15 minutes at a temperature of at least 250° C. in some embodiments, e.g. in a range of 250° C. to 450° C. in some more specific embodiments. In another approach, the thermal oxidation 56 comprises rapid thermal annealing (RTA) in an oxygen-containing atmosphere for between 15 seconds and 2 minutes. The oxygen-containing atmosphere may, for example, comprise pure oxygen ($O_2$) or a nitrogen/oxygen ($N_2/O_2$) mixture or an argon/oxygen ($Ar/O_2$) mixture. In one more specific embodiment for TiN as the conductive layer, RTA at 300-400° C. is performed for 30 seconds to one minute in pure $O_2$. In another more specific embodiment for TiN as the conductive layer, RTA is performed for one minute or less in a $N_2/O_2$ or $Ar/O_2$ atmosphere. In another more specific embodiment for TiN as the conductive layer, a furnace oxidation at 300-400° C. is performed for 30 minutes in pure $O_2$.

After the thermal oxidation 56 is completed, in an operation 58 a high-κ dielectric layer is deposited on top of the compositionally graded film produced by the thermal oxidation 56. For example, the deposited high-κ dielectric layer may be aluminum oxide, e.g. $Al_2O_3$ or another high-κ oxide such as $Ta_2O_5$, $ZrO_2$, $HfO_2$, $TiO_2$, barium strontium titanate oxide, strontium titanate oxide, or a combination of two (or more) of these materials. In other embodiments, the high-κ dielectric material may be a non-oxide dielectric material such as $Si_3N_4$. In some embodiments, the operation 58 may deposit the high-κ dielectric layer as a laminate such as a zirconium oxide/aluminum oxide/zirconium oxide (e.g., $ZrO_2$—$Al_2O_3$—$ZrO_2$, also known as ZAZ) laminate. These are merely non-limiting illustrative examples. The deposition may employ ALD, CVD, sputtering, vacuum evaporation, or so forth. In one specific illustrative embodiment, the operation 58 employs ALD.

If the capacitance structure is to be a repeated structure with two or more repetitions of the (conductive layer/high-κ dielectric layer) period, such as that illustrated in FIG. 2, then at a decision block 60 it is determined whether the last period of the has been deposited. If not, then flow passes back as indicated in FIG. 5 by return arrow 62 to the operation 54 in order to form the next (conductive layer/high-κ dielectric layer) period by way of the depositing the next conductive layer per operation 54, performing thermal oxidation per operation 56, and depositing the high-κ dielectric layer per operation 58. The looping 60, 62 occurs until at the operation 60 it is determined that the last period has been formed. (For the example of FIG. 2 in which there are four repetitions, the looping 60, 62 will occur three times to form the second, third, and fourth (conductive layer/high-κ dielectric layer) periods.

It will be appreciated that if the capacitance structure to be fabricated does not include repetitions of the (conductive layer/high-κ dielectric layer) period, then the decision operation 60 and the flow back as indicated by arrow 62 may suitably be omitted.

After the last period is done as recognized by the decision 60 (or if the decision 60 is omitted as appropriate for fabricating a capacitance structure that is not to be a repeated structure), flow passes to an operation 64 where a top conductive layer is deposited. In some embodiments, the material of the top conductive layer deposited in the operation 64 is the same as the conductive material that is deposited in the operation 54. In other embodiments, the material of the top conductive layer deposited in the operation 64 is different from the conductive material that is deposited in the operation 54. In some embodiments, the top conductive layer deposited in the operation 64 may be a TiN layer, a TaN layer, a tungsten layer, a tungsten nitride layer, a ruthenium layer, a ruthenium nitride layer, an Ir layer, Pt layer, or another low-resistivity material. The deposition operation 64 may employ any deposition technique suitable for the chosen conductive layer material and the desired thickness, such as ALD, CVD, sputtering, vacuum evaporation, or so forth.

Instead of depositing a top conductive layer, the operation 64 may deposit a top conductive structure. For example, to fabricate the structure of FIG. 2 the operation 64 may include filling in the trenches 14 with conductive material. In one approach this is done by depositing a thick layer of conductive material with a thickness sufficient to ensure that the trenches 14 are completely filled, and planarizing the thick layer to produce a planar surface for the array of trench capacitors.

In an optional operation 66, various types of further processing may be performed. For example, in the case of a trench capacitor array fabrication in which the conductive layer and high-κ dielectric layer are deposited both inside and outside of the trench, subsequent lithographically controlled etching may be performed to remove these layers outside of the trench. The optional operation 66 may additionally or alternatively include a metallization step for forming electrical interconnects to, within, and/or from the capacitance structure.

It will be appreciated that the capacitance structure fabrication process of FIG. 5 may in general be a component of a larger IC fabrication process so as to form an on-chip capacitance structure. For example, the larger IC fabrication process may include operations (not shown) for forming doped regions (e.g. by ion implantation), fabricating transistors and other IC components, forming shallow trench isolation (STI) regions, depositing metallization patterns, depositing passivation dielectric layers, and/or so forth. The process of FIG. 5 may be variously modified and/or integrated into such other IC fabrication processes. For example, it is contemplated for the operations 64 and 66 to be effectively combined to comprise a metallization step in which the top conductive structure is part of a metallization step that also forms electrical traces connecting the trench capacitors (or other-type capacitors) to other components of the IC layout. As a more specific example, in the case of a DRAM fabrication process, each storage cell of the DRAM may include a trench capacitor fabricated as disclosed herein coupled with a transistor, formed in MOS technology and including bit lines for reading and writing to the storage cells. In this case, the operation 64 may be integrated with the metallization process 66 that forms the bit lines.

In another variant, the operations 50, 52 for forming and preparing the trenches may be part of or ancillary to other IC fabrication processes, such as epitaxial layer deposition operations, etch stop layer depositions, formation of doped well isolation layers, and so forth.

The disclosed approaches for reducing the likelihood of delamination and reducing stress-induced wafer bending by way of the thermal oxidation of operation 56 forming the compositionally graded film 30 can be applied to trench capacitance structures of various types. The approach is particularly useful in embodiments in which the capacitance structure includes a high density of trench capacitors. For example, the disclosed approaches are expected to find particular benefit in multi-trench capacitance structures (for example, with a layout such as that of FIG. 1, or another trench capacitor array layout) in which there are at least 5 trench capacitors per 100 microns of wafer area. These compact capacitance structures are particularly prone to delamination and to inducing wafer warpage. Similarly, the disclosed approaches are expected to find particular benefit in multi-trench capacitance structures in which the trenches are deep trenches, e.g. deep trenches with an aspect ratio of 5:1 or higher.

Furthermore, the disclosed approaches for reducing the likelihood of delamination and reducing stress-induced wafer bending by way of the thermal oxidation of operation 56 forming the compositionally graded film 30 is not limited to trench capacitance structures, but rather can be applied to any type of capacitance structure that includes a conductive layer on which a dielectric layer is formed in which delamination and/or stress buildup is a problem that is adversely impacting device yield or otherwise having a negative impact on the semiconductor device manufacturing. For example, the disclosed approaches are applicable to planar capacitance structures that do not include trenches, or to single-trench capacitors, and/or so forth.

The disclosed approaches for reducing the likelihood of delamination and reducing stress-induced wafer bending by way of the thermal oxidation of operation 56 forming the compositionally graded film 30 can be employed for different ratios of thicknesses of the layers 22, 24 and of the compositionally graded film 30. Typically, the compositionally graded film 30 is thinner than the conductive layer 22, though this is not required. In some embodiments, the conductive layer 22 has a thickness of 40 nanometers or less, although larger thicknesses are contemplated. In some embodiments, the insulating layer 24 has a thickness of 30 nanometers or less, although larger thicknesses are contemplated.

It will be appreciated that the compositionally graded film 30 formed by the thermal oxidation 56 constitutes a structural component of fabricated the capacitance structure that can be detected and quantitatively characterized and/or imaged in various ways. For example, transmission electron microscopy (TEM) imaging can be used to image the compositionally graded film 30; or, a depth profiling technique such as Auger electron spectroscopy (AES) combined with ion sputtering can be used to measure a compositional depth profile of the compositionally graded film 30. Parameters of the thermal oxidation 56 such as the thermal oxidation temperature, thermal oxidation time, and oxygen-containing atmosphere can be readily optimized using such techniques to characterize test runs in which one or more repetitions of the (conductive layer/high-κ dielectric layer) period are formed using various combinations of temperature, time, and atmosphere composition. Additionally or alternatively, the parameters of the thermal oxidation 56 may be optimized by detecting whether delamination occurs, since the delamination is readily observed via TEM imaging, and by directly assessing wafer warpage of the test runs. In general, the temperature and time of the thermal oxidation should be sufficiently long to produce suitable ingress of oxygen from the oxygen-containing atmosphere into the surface of the conductive layer 22 so as to form the compositionally graded layer 30.

In some experiments using furnace oxidation for 30 minutes, it was found that the illustrative compositionally graded film 30 of FIG. 3 was formed as follows: the TiNO and $TiO_2$ was formed after about 10 minutes. After about 15 minutes, a region of about 50% $TiO_2$ was present. By the end of the 30 minute furnace oxidation the uppermost region was about 80% oxygen.

In the following, some additional embodiments are described.

In a nonlimiting illustrative embodiment, a method of manufacturing a trench capacitance structure is disclosed, the method comprising: forming a trench in a base material; forming a conductive layer at least in the trench; performing thermal oxidation of a surface of the conductive layer to produce a compositionally graded film on the conductive layer; and forming a dielectric layer on the compositionally graded film. In some embodiments, the method further comprises repeating the forming of the conductive layer, the performing of thermal oxidation, and the forming of the dielectric layer at least one time to form the trench capacitance structure as a multilayer trench capacitance structure. In some embodiments, the conductive layer comprises a titanium nitride (TiN) layer and the compositionally graded film comprises titanium dioxide ($TiO_2$). In some more specific embodiments, the thermal oxidation comprises furnace oxidation in an oxygen-containing atmosphere for at least 15 minutes at a temperature in a range of 250° C. to 450° C. In some more specific embodiments, the thermal oxidation comprises rapid thermal annealing in an oxygen-containing atmosphere for between 15 seconds and 2 minutes. In some more specific embodiments, the furnace oxidation or rapid thermal annealing is performed in an oxygen-containing atmosphere comprising pure oxygen or an $N_2/O_2$ mixture or an $Ar/O_2$ mixture.

In a nonlimiting illustrative embodiment, a capacitance structure comprises: a metal nitride layer; a dielectric layer disposed on the metal nitride layer; and a compositionally graded film disposed between the metal nitride layer and the dielectric layer. The compositionally graded film comprises a metal oxide, in which the metal of the metal oxide is a metal of the metal nitride layer. In some more specific embodiments, the compositionally graded film includes a compositional gradient from a lowest oxygen/nitrogen ratio adjacent the metal nitride layer to a highest oxygen/nitrogen ratio adjacent the dielectric layer.

In a nonlimiting illustrative embodiment, a multilayer trench capacitor two or more periods of the capacitance structure of the immediately preceding paragraph lining a trench formed in a base material.

In a nonlimiting illustrative embodiment, a capacitance structure comprises a metal nitride layer, a compositionally graded film formed on a surface of the metal nitride layer by thermal oxidation, and a dielectric layer disposed on the compositionally graded film.

In a nonlimiting illustrative embodiment, a capacitance structure comprises a TiN layer, a compositionally graded film formed on a surface of the TiN layer by thermal oxidation, and a dielectric layer disposed on the compositionally graded film. In some more specific embodiments, the compositionally graded film includes a lower region comprising mixture of titanium nitride oxide (TiNO) and $TiO_2$ adjacent the TiN layer, an upper region adjacent the dielectric layer in which an oxygen/nitrogen ratio is oxygen rich, and an intermediate region that is mostly $TiO_2$ interposed between the upper region and the lower region.

In a nonlimiting illustrative embodiment, a multilayer trench capacitor comprises two or more periods of the capacitance structure of the immediately preceding paragraph lining a trench formed in a base material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitance structure comprising:
   a metal nitride layer comprising a titanium nitride (TiN) layer;
   a dielectric layer disposed on the metal nitride layer, wherein the dielectric layer comprises $Al_2O_3$; and
   a compositionally graded film disposed between the metal nitride layer and the dielectric layer, the compositionally graded film comprising titanium dioxide ($TiO_2$) and including:
      a lower region comprising a mixture of titanium nitride oxide (TiNO) and $TiO_2$ adjacent the TIN layer,
      an upper region adjacent the dielectric layer in which an oxygen/nitrogen ratio is oxygen rich, and
      an intermediate region comprising $TiO_2$ interposed between the upper region and the lower region.

2. The capacitance structure of claim 1 wherein the compositionally graded film includes a compositional gradient from a lowest oxygen/nitrogen ratio adjacent the metal nitride layer to a highest oxygen/nitrogen ratio adjacent the dielectric layer.

3. The capacitance structure of claim 1 comprising:
   two or more periods of the multilayer comprising the metal nitride layer, the dielectric layer disposed on the metal nitride layer, and the compositionally graded film disposed between the metal nitride layer and the dielectric layer lining a trench formed in a base material.

4. A capacitance structure comprising:
   a titanium nitride (TiN) layer;
   a compositionally graded film comprising titanium dioxide ($TiO_2$) formed on a surface of the TiN layer by thermal oxidation; and
   a dielectric layer disposed on the compositionally graded film wherein the dielectric layer comprises silicon nitride ($Si_3N_4$), aluminum oxide ($Al_2O_3$), hafnium silicates (HfSiON), tantalum oxide ($Ta_2O_5$), barium strontium titanate oxide, strontium titanate oxide, and combinations thereof, or a laminate zirconium oxide/aluminum oxide/zirconium oxide laminate;
   wherein the compositionally graded film includes:
      a lower region comprising a mixture of titanium nitride oxide (TiNO) and $TiO_2$ adjacent the TIN layer,
      an upper region adjacent the dielectric layer in which an oxygen/nitrogen ratio is oxygen rich, and
      an intermediate region comprising $TiO_2$ interposed between the upper region and the lower region.

5. The capacitance structure of claim 4 wherein the dielectric layer comprises an oxide layer.

6. A trench capacitance structure comprising:
   a trench in a base material;
   a structure lining the trench, the structure including at least one period comprising a titanium nitride (TiN) or tantalum nitride (TaN) layer and a compositionally graded film disposed on the TiN or TaN layer and a dielectric layer disposed on the compositionally graded film, wherein the compositionally graded film comprises a titanium oxide or a tantalum oxide;
   a liner oxide between the base material and the structure; and
   a top conductive material filling the trench lined with the structure;
   wherein the dielectric layer comprises silicon nitride ($Si_3N_4$), aluminum oxide ($Al_2O_3$), hafnium silicates (HfSiON), tantalum oxide ($Ta_2O_5$), barium strontium titanate oxide, strontium titanate oxide, and combinations thereof, or a laminate zirconium oxide/aluminum oxide/zirconium oxide laminate; and
   wherein the compositionally graded film includes:
      a lower region comprising a mixture of titanium nitride oxide (TINO) and titanium dioxide ($TiO_2$) or a mixture of tantalum nitride oxide (TaNO) and tantalum dioxide ($TaO_2$) adjacent the TiN or TaN layer,
      an upper region adjacent the dielectric layer in which an oxygen/nitrogen ratio is oxygen rich, and
      an intermediate region that comprising $TiO_2$ or $TaO_2$ interposed between the upper region and the lower region.

7. The trench capacitance structure of claim 6 wherein the structure includes at least two periods.

8. The capacitance structure of claim 4, wherein the compositionally graded film includes a compositional gradient from a lowest oxygen/nitrogen ratio adjacent the metal nitride layer to a highest oxygen/nitrogen ratio adjacent the dielectric layer.

9. The capacitance structure of claim 4, wherein the capacitance structure lines a trench formed in a base material.

10. The capacitance structure of claim 6, wherein the compositionally graded film is formed by thermal oxidation of the TIN or TaN layer.

11. The capacitance structure of claim 1 comprising:
    two or more periods of the multilayer comprising the metal nitride layer, the dielectric layer disposed on the metal nitride layer, and the compositionally graded film disposed between the metal nitride layer and the dielectric layer lining a plurality of trenches formed in a base material.

12. The capacitance structure of claim 11 wherein the plurality of trenches are arranged as a two-dimensional grid of capacitance cells.

13. The capacitance structure of claim 12 wherein each capacitance cell includes a plurality of mutually parallel trenches.

14. The capacitance structure of claim 13 wherein the plurality of mutually parallel trenches of each capacitance cell are oriented orthogonally to the mutually parallel trenches of immediately adjacent capacitance cells in the two-dimensional grid of capacitance cells.

15. The capacitance structure of claim 4 comprising:
one or more periods of the multilayer comprising the TiN layer, the compositionally graded film comprising $TiO_2$, and the dielectric layer lining a plurality of trenches formed in a base material.

16. The capacitance structure of claim 15 wherein the plurality of trenches are arranged as a two-dimensional grid of capacitance cells.

17. The capacitance structure of claim 16 wherein each capacitance cell includes a plurality of mutually parallel trenches.

18. The capacitance structure of claim 17 wherein the plurality of mutually parallel trenches of each capacitance cell are oriented orthogonally to the mutually parallel trenches of immediately adjacent capacitance cells in the two-dimensional grid of capacitance cells.

19. The trench capacitance structure of claim 6, wherein the trench comprises a plurality of trenches.

20. The capacitance structure of claim 19 wherein the plurality of trenches are arranged as a two-dimensional grid of capacitance cells.

\* \* \* \* \*